United States Patent [19]

Dorey II et al.

[11] 4,374,869

[45] Feb. 22, 1983

[54] SELECTIVE METAL ETCH TECHNIQUE

[75] Inventors: John K. Dorey II, Ewing Township, Mercer County, N.J.; James T. Huneke, Lower Makefield Township, Bucks County, Pa.

[73] Assignee: Western Electric Company, Inc., New York, N.Y.

[21] Appl. No.: 339,949

[22] Filed: Jan. 18, 1982

[51] Int. Cl.$^3$ ............................................. H05K 3/40
[52] U.S. Cl. ..................................... 427/97; 118/505; 427/272; 156/661.1; 156/656; 156/664; 156/901
[58] Field of Search .................. 118/505; 427/96, 97, 427/272; 156/661.1, 659.1, 656, 664, 901, 902

[56] References Cited

U.S. PATENT DOCUMENTS

| | | | |
|---|---|---|---|
| 2,453,582 | 11/1948 | Morgan | 118/721 |
| 3,002,847 | 10/1961 | Shaffer et al. | 118/505 X |
| 3,170,810 | 2/1965 | Kagan | 118/721 X |
| 3,650,860 | 3/1972 | Rolker, Jr. | 427/96 X |
| 3,841,261 | 10/1974 | Hudson et al. | 118/505 |
| 4,159,222 | 6/1979 | Lebow et al. | 156/902 X |
| 4,247,361 | 1/1981 | Shaheen | 156/659.1 X |

OTHER PUBLICATIONS

"High-Speed Circuit Etch for the Precision Etching of Copper Laminates", Philip A. Hunt Chem. Corp. Tech. Bulletin, No. 12, Aug. 23, 1976.
"Spray Masking System", W. J. Tesche, Western Electric Technical Digest No. 22, Apr. 1971.

*Primary Examiner*—John D. Smith
*Assistant Examiner*—Bernard F. Plantz
*Attorney, Agent, or Firm*—Joel F. Spivak

[57] ABSTRACT

A method of forming a flexible printed wiring board having a metal substrate includes the steps of etching through-holes in the metal substrate by means of an etch resistant ferro electric mask placed over the substrate and employing a viscous sealant such as polyethylene or polypropylene glycol between the mask and the substrate. The mask is held to the substrate with the sealant therebetween by means of a magnetic field. The substrate is then treated with a ferric chloride etch solution to etch away the desired through-holes in the metal substrate. Thereafter, the substrate may be coated with a polymeric coated by means of fluidized bed or electrostatic coating techniques as taught in the prior art.

9 Claims, No Drawings

SELECTIVE METAL ETCH TECHNIQUE

TECHNICAL FIELD

This invention relates to a method for selectively etching a pattern in a metal by means of a magnetic etch mask and more particularly to a method for fabricating a flexible printed circuit board utilizing metal substrates.

BACKGROUND OF THE INVENTION

It should be understood that the invention can be used generally for imparting etch patterns on a metal substrate using an etch resistant mask. However, the invention shall be particularly described with reference to its use in making flexible printed circuit boards having metal substrates.

In both additive and substractive techniques for printed circuit manufacture, a great variety of base materials has been employed as a substrate material. One of the substrates of interest utilizes a thin metal foil such as a 1 to 7 mil steel foil which is coated with a flexible dielectric material. Circuit patterns are then formed over the flexible circuit board by any of the well known coating techniques. In order to be suitable for use as a printed circuit board, the metal foil must first be processed so as to provide a plurality of spaced through-holes therein. The metal foil containing the through-holes may then be coated by any of the known coating techniques with an appropriate polymer coating. For example, one may use coating techniques and compositions as set forth in the patent issued to J. J. Chang, U.S. Pat. No. 4,107,837. Alternatively, one may refer to patents issued to C. A. McPherson, U.S. Pat. No. 4,121,015 and R. B. Lewis and T. A. Giversen, U.S. Pat. No. 4,176,142 which provide alternate coating formulations suitable for providing flexible printed circuit boards using thin metal foil substrates. The teachings of all of the above patents are incorporated herein by reference.

One of the problems in manufacturing the flexible printed circuit board is that of providing sharp, well defined, through-holes. Previous solutions to the problem of providing through-holes by means of selective chemical milling or etching have involved techniques such as printing an image on the metal with an etch resistant ink followed by chemical etching; or photoimaging a photosensitive resist that is spread on the metal substrate, imaged, cured and developed, and then, etching the remaining exposed areas of the metal substrate; or laminating photosensitive film onto the metal and then light imaging an etch mask pattern thereon followed by etching. When printing with an etch resistant ink, or using a photoresist, there are often problems due to the presence of pin-holes in the ink or resist. Furthermore, the coatings must be self-adhesive on the substrate, even under the vigorous spray action of liquid etchant and must also be strippable after the sample is etched. Each of the above mentioned methods have often been found to be less than adequate with regard to either its adhesiveness or its ability to be stripped. Still another factor is that none of the prior art etch mask coatings or films are reusable. If one attempts to use a metal mask which has been coated so as to be etch resistant, great difficulty is encountered in placing the mask on the substrate to be etched so as to prevent undercutting and seepage of the liquid etchant between the mask and the substrate thereby etching areas of the substrate which were to remain unetched. Such masks made from or containing a magnetic metal and held in place on the substrate by a magnet have been described in U.S. Pat. Nos. 3,002,847 and 3,170,810.

It would, therefore, be desirable to provide a method whereby a reusable mask, particularly a ferro-magnetic mask, can be employed which adheres well to the substrate so as to prevent seepage of the etchant between the mask and the substrate and yet is easily removed from the substrate subsequent to etching.

SUMMARY OF THE INVENTION

A method of etching a substrate comprises placing an etch resistant, ferro-magnetic etch mask on the substrate together with a film of a sealant between the mask and substrate for sealing the space between the mask and substrate by means of surface tension or capillary action so as to prevent attack by the etch solution in said space. The sealant must be somewhat soluble in the etch solution. The mask is held in place by means of a magnetic force applied thereto. Etch solution is then applied to the substrate so as to etch the unmasked areas of the substrate.

DETAILED DESCRIPTION

While the method described herein is generally useful for etching any sort of pattern in any type of substrate and particularly to a metallic substrate, the invention will be described more particularly in terms of the manufacture of a flexible metal coated printed circuit board.

Typically, a flexible printed circuit board comprises a thin metal substrate such as a steel foil having a thickness of from about 1 to 7 mils with a plurality of through-holes therein. The metal substrate is coated with a polymer using conventional techniques such as fluidized powder bed coating or electrostatic coating techniques. Suitable powder coatings and coating techniques are described in the aforementioned prior art patents which have been incorporated herein by reference. A problem which has been encountered in the manufacture of such a flexible printed circuit board has been the step of providing the through-holes in the metal substrate. In providing such through-holes by means of chemical etching it would be preferred to employ etch masks which are free of pin-holes, have good adhesion to the substrate such that etchant solution cannot creep between the substrate and the mask, are easily removed from the substrate after etching and are further reusable. The novel method as set forth herein meets all of these requirements.

In accordance with the novel method one employs an etch resistance ferro-magnetic etch mask, a sealant which is applied between the etch mask and the substrate to be etched, a magnetic field to hold the etch mask in place on the substrate and etch solution to etch away the exposed portions of the substrate.

A typical etch mask comprises a ferro-magnetic steel foil typically from 1 to 20 mils thick having the desired etch pattern therein and which has been coated with an etch resistant material so as to protect it from the etchant. The particular etch resistant material may vary with the particular etchant used, however, in the manufacture of printed circuit boards utilizing metal foil substrates which are etched with ferric chloride solution, suitable etch resistant coatings are polymeric coatings such as polyacrylate or polymethylacrylate coatings. The sealant material which is applied between the etch mask and substrate should be a liquid or a viscous or waxy material which becomes liquid at the temperature of the etch solution. It has further been discovered that the sealant must be somewhat soluble in the etch solution. This is true due to the fact that since the sealant is generally applied over the substrate surface and covers the portions of the substrate to be etched as well as those portions protected by the etch mask, unless the sealant is somewhat soluble in the etchant it would prevent etching of the substrate. Similarly, even if the sealant were applied on the surface of the etch mask which mask is then laid down over the substrate, when the mask is clamped to the substrate by means of a magnetic force, sealant tends to ooze out from under the mask thence covering a portion of the substrate to be etched. It has been discovered that certain polymeric materials, such as polypropylene glycol and polyethylene glycol are preferred sealants. These sealants may be applied to the substrate and/or mask and during etching, the etchant will remove essentially only the sealant which is exposed and will not substantially penetrate the sealant which lies under the etch mask. In this way, etching can be accomplished in the desired areas while those areas protected by the masks remain protected as the etchant will not seep under the mask and attack the underlying substrate. Preferred polyethylene and polypropylene glycols are generally fairly viscous or waxy materials which are either liquid at room temperature or become liquid at the operating temperature of the etchant, typically 35° to 60° C. The preferred polyglycols generally exhibit average molecular weights of from 400 to about 2,000, the lower molecular weight glycols being viscous liquids at room temperature and the higher molecular weight glycols being wax-like materials at room temperature. As indicated above, the sealant may be applied to either the substrate or the etch mask or both. The method of application of the sealant is generally not critical. When the sealant is a liquid it may be brushed on, sprayed on, or the material dipped into the sealant to provide a sealant film over the substrate and/or the mask. When the sealant is a wax-like material it may be heated to become liquefied and applied in the same manner as a sealant which is liquid at room temperature or may be spread on in the form of a wax. In addition, these polyglocols have been found to not alter the activity of the etching solution. It may be noted that when materials which are relatively insoluble in the etchant were employed as sealants such as silicones or carnauba wax, the etchant could not penetrate the sealant which prevented proper etching. The mask is generally held in place on the substrate by means of a magnetic material placed on the opposite side of the substrate. Typically, one can use a flexible magnetic material such as ferrite powder bonded by means of a polymeric bonding agent so as to form a flexible magnet. Chemical etching of copper or steel substrates is typically done by a commercially available ferric chloride etching solution which generally operate at elevated temperatures. The particular temperature employed for the etching solution depends upon the thickness of the foil substrate to be etched and the desired etch speed.

It may be noted that since the etched mask employed in accordance with this invention is a solid metallic member, it is free of pin-holes. In addition, by using a ferro-magnetic etch mask and the magnetic field to hold the mask onto the substrate, adequate adhesion of the mask to the substrate is provided and the mask is easily removed from the substrate by merely removing the magnetic field which holds it in place. Furthermore, such etch masks are extremely durable and are, therefre, reusable for many applications.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A method of selectively etching a pattern in a substrate by magnetically holding a magnetic, etch resistant mask over the substrate and applying an etchant material over the mask and substrate, and prior to etching, applying a sealant between the mask and substrate which sealant is at least partially soluble in the etchant and is capable of preventing etchant from seeping under the mask when the mask is magnetically held in place.

2. The method recited in claim 1 wherein the substrate is a metal and the sealant is a liquid or waxy polyglycol.

3. The method recited in claim 2 wherein the polyglycol is a polyethylene glycol or a polypropylene glycol having an average molecular weight of from 400 to 2,000.

4. The method recited in claims 2 or 3 wherein the etchant is an aqueous solution of ferric chloride.

5. The method recited in claims 1, 2 or 3 wherein the sealant is applied over the surface of the substrate.

6. A method of making a blank flexible printed circuit board having a plurality of spaced through-holes therein and comprising a thin flexible metal foil core coated with a flexible polymeric coating comprising the steps of:

(a) magnetically holding a magnetic, etch resistant etch mask having the desired through-hole pattern therein firmly in place over the metal foil and treating the metal foil with an etch solution so as to etch the desired holes in the metal foil, including the step of applying a sealant layer which is at least partially soluble in the etch solution between the mask and the metal foil prior to holding the mask in place, the sealant being capable of preventing etchant from seeping under the mask while allowing the etchant to etch the metal foil; and (b) coating the etched foil with a flexible polymeric coating.

7. The method recited in claim 6 wherein the etchant is a liquid or waxy polyglycol.

8. The method recited in claim 7 wherein the polyglycol is selected from the group consisting of polyethylene glycols and polypropylene glycols having an average molecular weight of from 400 to 2,000.

9. The method recited in claim 8 wherein the etchant is ferric chloride.

* * * * *

UNITED STATES PATENT AND TRADEMARK OFFICE
CERTIFICATE OF CORRECTION

PATENT NO. : 4,374,869
DATED : February 22, 1983
INVENTOR(S) : J. K. Dorey II, J. T. Huneke It is certified that error appears in the above—identified patent and that said Letters Patent is hereby corrected as shown below:

In the claims, Column 4, claim 7, line 55, "etchant" should read --sealant--.

Signed and Sealed this

Twelfth Day of July 1983

[SEAL]

Attest:

Attesting Officer

GERALD J. MOSSINGHOFF
Commissioner of Patents and Trademarks